Feb. 19, 1963 C. R. WINSTON 3,078,393

DRIVER FOR INDUCTIVE LOAD

Filed Jan. 3, 1961 2 Sheets-Sheet 1

INVENTOR
CHARLES R. WINSTON

BY R. C. Kerry

ATTORNEY

INVENTOR
CHARLES R. WINSTON
BY R. C. Terry
ATTORNEY 3,078,393
Patented Feb. 19, 1963

3,078,393

DRIVER FOR INDUCTIVE LOAD

Charles R. Winston, Skokie, Ill., assignor to Teletype Corporation, Skokie, Ill., a corporation of Delaware Filed Jan. 3, 1961, Ser. No. 80,374
12 Claims. (Cl. 317—123)

Figure 1:
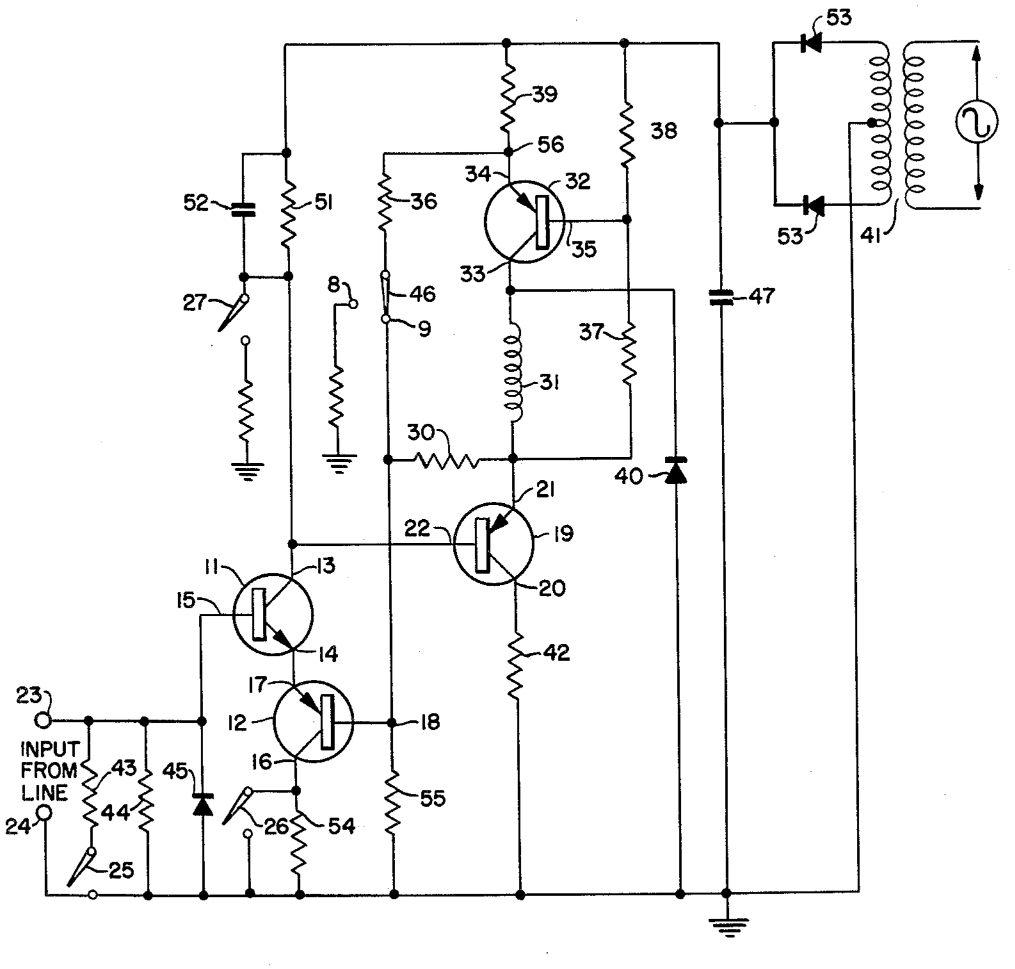

This invention relates to circuitry for energizing inductive devices and more particularly for furnishing a fast rising current to an inductive device and upon de-energization thereof for discharging it rapidly.

Inductor driving circuits have been widely used in many areas of industry wherever an inductive device is to be energized by an input signal itself not strong enough to energize the inductor directly. These driving devices have generally been employed to activate an inductor upon a distinct change in the input signal whereupon the signal is then amplified and applied via voltage amplifier circuitry to the coil of the device to be energized. The employment of a single transistor to drive inductive devices, though acceptable in many instances, does not provide sufficiently reliable operation as is required by sensitive circuitry. Many of the problems encountered in previously disclosed circuitry relate to the inherent characteristics of a single transistor amplifier, these being: that the leakage current between the collector and the base is too large and therefore does not allow the transistor to be driven fully to cut off, thereby allowing a small current to flow in the inductor when the inductor should be fully off; slight marginal error occurring when the transistor becomes forward biased, in that partial saturation could possibly occur which could result in permanent damage to the semiconductor device being employed, and the basic insensitivity of a single component amplifier.

Accordingly, an object of the invention is the amplification of a control pulse sufficiently to operate an inductive device requiring an operating pulse of substantially greater magnitude than the control pulse under conditions of high sensitivity, high stability, low power consumption and low maintenance requirements.

Another object of the invention is to achieve a fast build up of current in an inductive device by the employment of a constant current device for supplying that current.

Another object of the invention is to provide, for an inductive device, a driving circuit having bi-stable operating characteristics.

Still another object of this invention is to provide an economical, yet extremely reliable transistor circuit to energize inductive devices, the circuit being selectively responsive to several different control signals while maintaining a constant sensitivity.

A feature of this invention is the employment of a constant current amplifier circuit which is placed in series with the inductive device to be driven. This arrangement allows maximum use of the constant voltage as well as the constant current characteristics of a constant current amplifier to achieve fast energization of the inductive device.

Another feature of this invention is the employment of a bi-stable input circuit which effects through regenerative feedback, a snap-action so as to allow the transistor switches employed to be fully on or fully off, thus preventing the possibility of damage to the active components which might result from the partial activation of one of the active components.

Still another feature of the invention is the provision of means for varying the impedance of the input circuit to accommodate different control currents while maintaining constant the voltage presented to an input amplifier.

Yet another feature of the invention is the driving of an inductive device by current amplifiers serially connected with the inductive device, one of the current amplifiers controlling the other and in turn being controlled by a source of a control voltage.

A further feature of the invention is that one of the current amplifiers affords the path for discharging the back electromotive force generated by the collapse of the energizing current in the inductive device.

In accordance with one embodiment of the invention a voltage sensitive input circuit is provided which is responsive to a predetermined voltage to effect a change in a trigger-like circuit, which has generally the configuration of a Schmitt trigger, from one of its two possible operative conditions to the other as long as that voltage or a greater voltage is maintained at the input of the voltage sensitive circuit. A current amplifier is provided which amplifies the input circuit wave form and applies the amplified wave to a regenerative feed-back loop, thus imparting stability to the trigger-like circuit. In addition to applying the current pulses to the regenerative feed-back loop the current amplifier also applies an activating potential to the input circuit of a constant current amplifier. An inductance to be operated is serially connected between the output of the constant current amplifier and current amplifier. As the current for operating the inductor begins to build up through both current amplifiers and the inductor in series, when the trigger circuit has initiated a control pulse, a second regenerative feed-back loop becomes effective. This second regenerative feed-back loop contains both current amplifiers, the inductor and the trigger circuit. When sufficient voltage appears at the input of the trigger circuit the snap-action is effected due to the two regenerative feed-back loops which enable the entire circuit to be either fully conductive or fully off, so that no chance of a half-on condition may exist. The employment of the constant current amplifier allows a constant potential to be placed across the inductor while the current is building up therein to reach its predetermined level set by a current metering resistor placed in the constant current amplifier circuit.

When the input signal falls below the predetermined level, which level is determined by a voltage divider network connected to the trigger-like circuit and the magnitude of the control current flowing therein, the latter circuit will return to its initial condition and initiate a change in both regenerative feed-back loops, driving the first current amplifier into fully nonconductive state. When this occurs the residual current in the inductor will collapse causing a large back electromotive force (E.M.F.) to be generated. This E.M.F. may severely damage the active components of this circuit unless it is dissipated, as the magnitude of this back E.M.F. may reach several times the magnitude of the voltage provided by the power supply. The first current amplifier serves to clamp to ground potential the positive kick-back. The reverse E.M.F. is also dissipated to ground potential through a rectifying means, so that the inductor has no potential difference across its terminals and is held near ground potential.

In accordance with another embodiment of the invention, a voltage sensitive input circuit similar to the one provided in the prior embodiment is used to render operative an inductor driver circuit employing a differential amplifying circuit in conjunction with a current amplifier which is part of the differential amplifier, and a constant current amplifier to provide positive and reliable means for driving an inductor. A first amplifying device is placed in the input circuit which is responsive to a predetermined voltage presented to the input circuit. Upon appearance of the predetermined voltage the first amplifying device becomes conductive and in so doing renders a second amplifying device nonconductive. A regenerative feedback loop between the first and second amplifying devices helps maintain the first amplifier device in either of two operative conditions. When the second amplifier becomes nonconductive it directly controls a third and fourth amplifier, the third being a current amplifier device, the fourth being a constant current amplifying device both of which are serially connected at opposite terminals to the inductor to be driven. A second regenerative feed-back loop between said first, third and fourth amplifier is established so as to assure bi-stable operation of the first amplifier. The two regenerative loops assure that all amplifiers, when conductive, will be fully conductive, thereby lessening the chance of error due to noises or stray signals.

The basic operation of the circuit is similar to that of the embodiment previously described. The main difference is in the employment of a differential type trigger circuit instead of the Schmitt-type trigger and in the presentation of a constant impedance to the power source.

Figure 2:
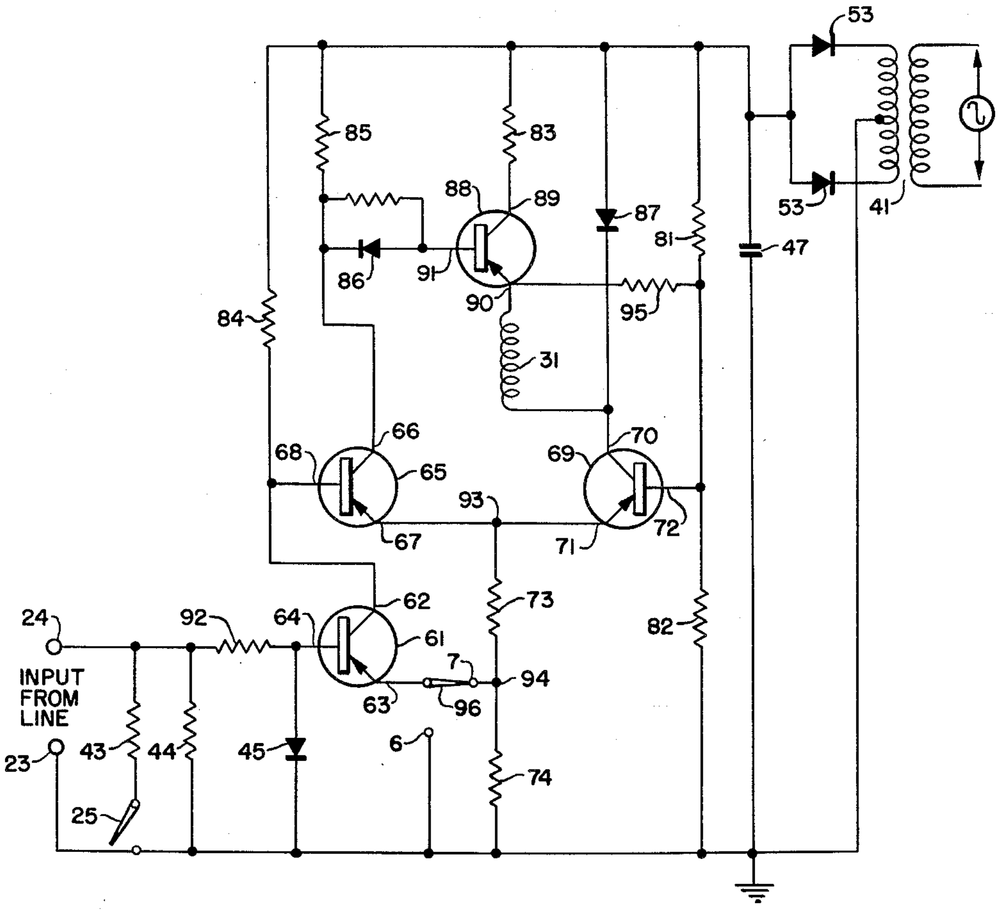

For a better understanding of the invention, reference may be had to the following detailed description, to be interpreted in the light of the accompanying drawings wherein:

FIG. 1 is a schematic circuit drawing showing a transistorized inductor driving device; and FIG. 2 is a schematic circuit drawing showing another embodiment of the invention.

Referring now to FIG. 1, wherein one form of transistorized inductor driving circuit is shown, the active components of the circuit are transistor 11, having collector 13, emitter 14 and base 15, transistor 12, having collector 16, emitter 17 and base 18, transistor 19, having collector 20, emitter 21 and base 22 and transistor 32, having collector 33, emitter 34 and base 35.

Power for operating the transistor system is supplied through transformer 41 connected to a source of alternating current at the usual commercial voltage, and having associated with its secondary a full wave rectifier system comprising diodes 53 and filter capacitor 47, to supply positive at the junction of the cathodes of the diodes and negative at the center tap of the transformer secondary.

The emitter-collector junctions of transistors 11 and 12 are connected in series, with the collector of transistor 11 connected through resistor 51, shunted by capacitor 52, to the positive terminal of the power supply, and the collector of transistor 12 connected through resistor 54 to the negative terminal of the power supply. Transistors 11 and 12 are shown as NPN and PNP types, respectively, which accounts for connection of the collector of the former to positive voltage and connection of the collector of the latter to negative voltage, with their emitters directly interconnected. Terminals 23 and 24, respectively, of an incoming line are terminated by resistor 44, which may also be shunted by resistor 43, for reasons which will be described hereinafter. Terminal 23 is connected to the base 15 of transistor 11 and terminal 24 is connected to the negative or ground side of the power supply. It will be assumed that negattive or ground potential is normally supplied to terminal 23 over the line, and under this condition transistor 11 is held at cut off. A biasing potential for the base of transistor 12 is supplied through a potential divider comprising resistors 39 and 36 in series, paralleled by resistors 38, 37 and 30, and resistor 55 common to both branches to hold the base of transistor 12 slightly positive by the potential difference across resistor 55, and this in effect forward biases the transistor, but it is nevertheless held nonconducting due to the fact that transistor 11 is cut off.

Transistor 19 is controllable from the collector 13 of transistor 11 by having its base 22 connected to that collector. Transistor 19, which is shown as being of type PNP has its collector 20 returned to negative through resistor 42 and its emitter 21 connected to the junction of resistors 30 and 37 and through the winding of the inductor 31, that is to be operated in response to a control signal, to the collector 33 of transistor 32. The emitter 34 of transistor 32 is connected through resistor 39 to the positive terminal of the power supply and the base 35 is connected to the junction of resistors 37 and 38.

A current pulse, representing the control information, if of the proper polarity, will develop a voltage drop across resistor 44 alone or resistors 43 and 44 in parallel. If the current pulse is of the opposite polarity the current will pass through diode 45 shunting the resistors without developing a significant voltage across the resistors. If the voltage is of the proper polarity, normally positive, and is of sufficient magnitude it will forward bias transistor 11, causing it to become conductive. Transistor 12 will also become conductive because it is already forward biased and operating current is supplied by transistor 11.

When this occurs the voltage at the collector 13 of transistor 11 drops considerably, from substantially the full potential of the power supply to the potential at the base 18 of transistor 12, developed across resistor 55 and applied through the emitter of transistor 12 and the emitter-collector junction of transistor 11. This potential is impressed upon the base 22 of transistor 19, which is connected to the collector of transistor 11. Transistor 19 is wired to have emitter follower characteristics, and is a current amplifier in this case.

Due to the inherent characteristics of the emitter follower circuit the potential at the base 22 will appear on the emitter 21 of the same transistor, a considerable amplification of current being available. Resistor 30, because of the lowered voltage on the emitter 21 of transistor 19 as that transistor becomes conductive, causes the voltage on the base 18 of transistor 12 to decrease in magnitude, thereby forming a regenerative feed-back loop with transistor 11, and lowering the potential of emitter 14 of transistor 11, which causes transistor 11 to become more conductive.

Another regenerative feed-back loop is established including the base-emitter junction 22—21 of transistor 19, the inductor 31, the collector-emitter junction 33—34 of transistor 32, resistor 36, base-emitter junction 18—17 of transistor 12, and emitter-collector junction 14—13 of transistor 11 to the base 22 of transistor 19. This regenerative loop helps to stabilize and sustain operation of transistor 11 when it reaches either one or the other of the two stable conditions of the circuit.

Once activated, and as long as an input potential exceeding a predetermined magnitude remains thereon, transistor 11 and transistor 12 will remain in their conductive state, thereby placing a lowered potential on the emitter 21 of transistor 19. The lowering of the potential of emitter 21 produces a proportional lowering of the potential at the junction of resistors 37 and 38, of sufficient magnitude to forward bias transistor 32. As transistor 32 becomes forward biased and begins to conduct, a large difference of potential appears across the inductor 31 and this voltage maintains itself, due to the characteristics of transistor 32 as a constant current amplifier and the emitter follower connected transistor 19 which acts as a driver for the constant current amplifier, decaying very slightly until a predetermined current flow has been established in the emitter-collector junction 34—33 of transistor 32.

When the predetermined current level is reached the constant current limiting circuit comprised of transistor 32 and current metering resistor 39, become effective, and allows only a predetermined current, held at a constant value, to flow through transistor 32, inductor coil 31, transistor 19 and resistor 42 to ground.

The constant voltage portion of the voltage-current wave form characteristic of the constant current amplifier is utilized to allow the coil 31 to reach a quiescent current value as fast as it can, while still limiting the total amount of current that will flow once the circuit becomes stabilized. Normally a voltage drop occurs in accordance with the formula $$E=L\frac{di}{dt}$$

across the coil due to the series resistance in the circuit. By keeping the voltage constant, there will be no occurrence of the usual decrease in voltage across the series resistance of the inductor, which tends to slow the rise time of the current in accordance with the representative formula $$E=L\frac{di}{dt}$$

wherein a decrease in voltage will result in a corresponding decrease in the rate of change of current, and the result is a fast rising in the inductor, reaching its predetermined value in as short a time as possible. The constant current amplifier is used to drive the inductor and simultaneously to limit the amount of current flowing through it.

The snap-action establishing the bi-stable condition of transistors 11 and 12, defined in more particularity later, can generally be said to allow this circuit to be either fully conducting or fully nonconducting, thereby allowing no intermediate stages of conduction to prevail in a transistor for any appreciable period of time, as a half-on transistor, indicating a partially energized inductor, might be severely damaged, due to the particular parameters of switching circuitry.

Upon return of the control signal to the noncontrol potential, the bi-stable circuit composed of transistors 11 and 12 returns to its nonconductive state, and this places a large voltage, the full potential of the power source, on the collector 13 of transistor 11. This potential cuts off transistor 19, which thereupon back biases transistor 32, which instantaneously becomes nonconductive thus interrupting the current path through resistor 39, the emitter-collector junction of transistor 32, the inductor 31, transistor 19 and resistor 42 to ground. Due to the collapsing of the current in the inductor 31, a back electromotive force is generated of several times the magnitude of the power source, which normally causes a slow de-energization of the inductor, and which can damage the low voltage components. The crystal diode 40, functioning as a voltage clamp, allows the back or negative E.M.F. to be discharged directly to ground. The positive kickback is removed from the inductor through the emitter-collector junction 21—20 of transistor 19 to ground, thus completing the discharge loop of the inductor. This dual discharge path provides extremely fast decay of the back E.M.F. which corresponds to the current rise when the inductor is first energized.

The regenerative feed-back loops referred to above are activated when, transistor 11 becoming forward biased, the collector 13 drops from the maximum potential available at the power supply to that much lesser potential which appears at the base-collector junction 18—17 of transistor 12. This low voltage is impressed upon the base 22 of emitter follower 19 and thereby fed back regeneratively through the emitter 21 and resistor 30 to the base junction 18 of transistor 12 which tends to more fully saturate transistor 11. A further drop in the voltage on base junction 18 is observed when the voltage on resistor 36 drops due to energization of the inductor.

This voltage is normally applied to the base-collector junction of transistor 12 to maintain that junction at a greater positive value than the base of transistor 11 when there are no control pulses impressed through the input circuitry. The regenerative feed-back loops give the input circuit, comprised of transistors 11 and 12, a bistable action so that transistor 11 is quickly fully conductive or quickly fully nonconductive, remaining in the partial saturation region only during the switching transient time. This prevents the transistors employed from overheating due to excessive current dissipation in their junctions that could accompany partial saturation, and prevents the circuit from being noise sensitive while increasing its overall sensitivity.

One of the uses for which the circuitry of FIG. 1 is particularly well adapted is the driving of the selector magnet of a teletypewriter, and in that case the inductor 31 connected between transistors 19 and 32 would be the selector magnet. Several switches 25, 26, 27 and 46 shown in FIG. 1 have particular utility in adapting the circuit to respond to different types and magnitudes of telegraph signals. For exampde, relatively standard and widely used current magnitudes for neutral telegraph signals are 20 milliamperes and 60 milliamperes for one signaling condition, the other signaling condition in each instance, being no current. These two signaling conditions are usually called marking and spacing conditions, respectively. For 20 milliampere signals the switch 25 is left open and the required voltage for operating the inductive selector magnet 31 is developed across the single resistor 43. When the circuit is to respond to 60 milliampere current, switch 25 is closed to place resistor 43 in parallel with resistor 44, thereby developing the desired control voltage from the larger current flowing through the two resistors. For either of these values of neutral signals, switches 26 and 27 are open and switch 46 is closed on its contact 9. The circuit may be rendered responsive to 30 milliampere polar signals, which are characterized by a flow of current in one direction for the marking condition and in the opposite direction for the spacing condition, by opening switch 25 operating switch 46 to its contact 8 and closing switch 26.

It will be understood that when the circuit of FIG. 1 is used for operating the selector magnet of a teletypewriter the marking condition of incoming signals will cause all of the transistors to conduct and the inductor 31 to be energized during intervals of such condition, and the spacing condition will cause all of the transistors to be nonconductive and the inductor 31 to be de-energized. The selector magnetc of the teletypewriter may be blinded or rendered unresponsive to incoming signals, and maintained in a steady marking condition, by the closure of switch 27.

Reference is now made to FIG. 2 wherein another embodiment of the invention is shown. This embodiment employs generally the same inductor energizing circuitry as the first embodiment, but the mode of triggering is different. These two circuits, the previously described embodiment and this embodiment, provide equal sensitivity and reliability, but the latter circuit is useful in certain applications where it is undesirable to vary the drain on the power source as the device energizes and de-energizes the inductor to be driven; that is, the circuit provides a constant current drain from the source both during a rest condition and during the active cycle. It will be remembered that the first embodiment employs an input circuit resembling a Schmitt trigger, whose output is used to drive the energizing means comprised of a current amplifier and constant current amplifier with the inductor placed serially between them. This embodiment features a differential type amplifier with one active component of the differential amplifier becoming the constant current amplifier and a third active component having the characteristics of a current amplifier, the inductor being serially connected between the two and the discharge path for the back E.M.F. being through the current amplifier and a unidirectional current device as in the former embodiment.

Referring in greater detail to FIG. 2 the transistors 88 and 69 are respectively the current amplifier and the constant current amplifier, corresponding to transistors 19 and 32 in FIG. 1 and are PNP type. Transistor 69 forms, with transistor 65, the differential amplifier and transistor 61 is controlled by voltages applied to the input terminals 23 and 24. Transistors 61 and 65 are also of the PNP type. It should be noted that the diodes 53 in the power supply are reversed, relative to those in FIG. 1, so that it is the positive side of the power supply, at the center tap of transistor 41, that is grounded. Because transistor 61 is PNP type, whereas transistor 11 in FIG. 1 is NPN type, a potential negative to the grounded positive of the power supply must be applied to the base of transistor 61 to render that transistor conductive, and diode 45 has its cathode connected to the grounded positive side of the power supply whereas in FIG. 1 the correspondingly numbered diode has its anode connected to the grounded negative side of the power supply.

Only the transistor 65 is conductive when transistor 61 is cut off and the flow of current is from positive through resistors 74 and 73, the emitter-collector junction 67—66 of transistor 65 and resistor 85 to negative. Emitter-base current flows through the previously identified resistors connected to the emitter, through the emitter-base junction 67—68 and resistor 84, and collector 62 establishes the potential of the base 68 of transistor 61 at a value slightly more negative than the potential at junction point 93 where resistor 73 is connected to the emitters of transistors 65 and 69.

As soon as the control potential applied to transistor base 64 reaches the predetermnied turn-on point transistor 61 begins to conduct and the potential of collector 62 rises to the potential occurring at junction 94 of resistors 73 and 74. The rise in potential of the collector 62 of transistor 61, to which the base 68 of transistor 65 is connected, back biases transistor 65 and renders it nonconductive, causing transistor 69 to become conductive due to a change in potential at junction 93 which swings toward positive, as a result of the cutting off of transistor 65, and relative to the base potential of transistor 69, established by resistors 81 and 82 in series. When this happens an instantaneous regenerative feedback loop is formed comprising the base-emitter junction 68—67 of transistor 65, resistor 73 and the emitter-collector junction 63—62 of transistor 61, and this loop tends to impart to transistor 61 a snap-action or trigger-like action so as to place transistor 61 in one or the other of two stable states, either fully conducting or fully nonconducting.

Transistor 69 in addition to forming one-half of the differential amplifier circuit, comprising transistor 65 and 69, functions as a constant current amplifier, as previously stated, with resistors 73 and 74 forming the current metering resistor.

In addition to transistor 69 becoming conductive when transistor 65 becomes nonconductive, transistor 88 also becomes conductive because with transistor 65 cut off, the potential difference across resistor 85 decreases to or near zero. This swing of the junction of resistor 85 and collector 66 of transistor 65 toward negative forward biases semiconductor diode 86, which in turn forward biases transistor 88, which begins to conduct. As in the embodiment of the invention in FIG. 1, the current flow paths of transistors 69 and 88 are in series and inductor 31 is connected between them, and these transistors provide the energizing current for the inductor. Moreover, the circuitry of transistor 88 has the configuration of an emitted follower, and the emitter assumes substantially the potential of the base, now fixed by diode 86 and resistor 85. This corresponds to the clamping of the potential of the lower terminal of inductor 31 by the emitter of transistor 19 in FIG. 1.

When transistor 88 is conducting, virtually full negative potential of the power supply is placed upon the emitter 90 and hence, upon one terminal of the inductor 31. The other terminal of the inductor, being connected to collector 70 of transistor 69, is held at a relatively high positive potential. Once again the constant voltage and constant current characteristics as described in the previous embodiment act to present a constant voltage across the inductor and develop fast rising current pulse through the inductor. A constant voltage is impressed upon the inductor until the current which will flow in the inductor circuit, resistor 83, collector-emitter junction 89—90 of transistor 88, inductor 31, collector-emitter junction 70—71 of transistor 69 and resistors 73 and 74 reaches its steady value as determined mainly by the constant current transistor 69.

A second regenerative feed-back path is traced from the emitter 90 through resistor 95, base 72 and emitter 71 of transistor 69, junction 93, the emitter 67 and collector 66 of transistor 65 and diode 86 to the base 91 of transistor 88; and this regenerative feed-back loop tends to maintain transistor 69 stable as well as to reenforce the snap-action of transistor 61 in the same manner as previously described. The employment of the snap-action input transistor 61 as well as the differential amplifier which in itself provides a snap-like trigger action impart to this circuit a very fast switching time which in cooperation with the constant current circuit parameters allow the inductor to be energized with lower voltage than other types of circuitry known in the art.

A discharge circuit is provided which is similar to and functions similarly to the discharge circuit shown in the other embodiment. The main difference in the circuit in FIG. 2 is that it discharges to the ungrounded negative side of the power supply. This effects a zero potential difference across the inductor upon discharge, the entire inductor being held at the potential of the power source, with respect to ground. The discharge path formed by the discharge loop is comprised of resistor 83, collector-emitter junction 89—90 of transistor 88, the inductor 31 and unidirectional current device 87.

For reception of neutral control signals, of 20 milliamperes or 60 milliamperes, switch 25 is left open or closed, respectively, as before. For polar control signals, switch 96 is moved from contact 7 to contact 6.

While there has been described and illustrated herein two of the known embodiments of this invention, it will be apparent to those skilled in the art that changes may be made in these embodiments as set forth in the appended claims so that in certain cases features of the invention may be adopted to advantage without a corresponding use of the entire embodiment. Furthermore, although specific embodiments of the invention have been shown in the drawing and described in the aforementioned specification, it will be understood that the invention is not limited to the specific embodiments shown and described but is capable of modification and substitution of components and elements by one versed in the art without departing from the spirit of the invention.

What is claimed is:

1. An inductor driving circuit comprising a voltage responsive input means responsive to a predetermined potential and abruptly changing from a nonconducting to a conducting state when the predetermined voltage is applied thereto and abruptly changing back to the original state when the voltage falls below said predetermined magnitude, a current amplifier connected to said voltage responsive means, a first feed-back loop connected from the output of the current amplifier to the voltage responsive means for causing the abrupt changing of said input means between its conducting and nonconducting states, an inductor to be driven by and having one terminal thereof connected to said current amplifier, a constant current amplifier connected to the other terminal of said inductor, connecting means forming a second feed-back loop to the voltage responsive input means from the constant current amplifier for aiding the first mentioned feed-back loop, and a discharge circuit for discharging the inductor after the input voltage falls below the predetermined magnitude.

2. An inductor driving circuit comprising means serially connected in a signal line for developing a voltage in response to a line current, voltage responsive input means connected to said voltage developing means and capable of assuming one or the other of two steady states in accordance with the magnitude of the input signal, a current amplifier controlled by said voltage responsive means, connecting means forming a first regenerative feed-back loop from the current amplifier to the voltage responsive input means for aiding said voltage responsive means to assume one or the other of the two steady states, a constant current amplifier, an inductor to be driven serially connected between said current amplifier and said constant current amplifier, a second regenerative feed-back loop interconnecting said constant current amplifier and the voltage responsive input means for aiding said first regenerative feed-back loop, and discharge means including said current amplifier and a unidirectionally conductive device for discharging said inductor upon assumption by said voltage responsive input means of a particular one of those states.

3. An inductor driving circuit comprising a voltage responsive input means capable of assuming one or the other of two stable states, a current amplifying circuit operable therefrom, a first feed-back circuit energized by said current amplifier and connected to the voltage responsive input means to assure operation only in one or the other of two stable states, a constant current amplifier, an inductor to be driven serially connected between said current amplifier and said constant current amplifier and energized by said amplifiers when the input signal to the voltage responsive input means exceeds a predetermined magnitude, said current amplifier and inductor forming a second feed-back loop tending to further assure operation of the input means in only one or the other of the two stable states and a discharge path including a unidirectional current device and the current amplifier for discharging said inductor upon assumption by said input means of a particular one of its two states.

4. Apparatus as defined in claim 2 wherein the current amplifier and unidirectional current device are comprised of a transistor having base, collector, and emitter electrodes and a semiconductor diode, the discharge path being through the inductor, the emitter-collector junction of said transistor and through the semiconductor diode.

5. In a circuit for operating an inductor, a first and a second transistor interconnected in the configuration of a trigger circuit, said first transistor being responsive to and becoming conductive upon receipt of a control potential of a predetermined magnitude developed by a selectively determinable resistance placed serially in a control circuit connected to said first transistor, said second transistor being indirectly operable by said first transistor, a third transistor controlled by said first transistor and partially controlling said second transistor, a fourth transistor controlled by said third transistor and rendered conductive thereby upon said third transistor becoming conductive, and inductor serially connected between said third and fourth transistors, and a regenerative controlling means comprised of said third transistor said inductor said fourth transistor said second transistor and said first transistor and causing said first transistor to assume and sustain operation upon receipt of said control potential of the predetermined magnitude and upon cessation thereof to return to the condition prior to the application of the control pulse.

6. In a circuit for operating an inductor, a first and a second transistor interconnected in the configuration of a trigger circuit, said first transistor being responsive to and becoming conductive upon receipt of a control potential of a predetermined magnitude developed by a selectively determinable resistance placed serially in a control circuit connected to said first transistor, said second transistor being indirectly operable by said first transistor, a third transistor controlled by said first transistor and partially controlling said second transistor, a fourth transistor controlled by said third transistor and rendered conductive thereby upon said third transistor becoming conductive, an inductor serially connected between said third and fourth transistors, a regenerative controlling means comprised of said third transistor said inductor said fourth transistor said second transistor and said first transistor and causing said first transistor to assume and sustain operation upon receipt of said control potential of the predetermined magnitude and upon cessation thereof to return to the condition prior to the application of the control pulse, and discharge circuits including said third transistor and an asymmetrical current device for dissipating voltages opposing de-energization of said inductor upon return of said trigger circuit to its original output magnitude.

7. In an inductor driving circuit, a trigger circuit responsive to a control pulse and caused by said control pulse to substantially change its output magnitude and to return to its original output magnitude upon cessation of said control pulse a first transistor operable by said trigger circuit and having associated therewith circuitry of a configuration to impart to the transistor current amplifier characteristics a second transistor operable by said first transistor and having associated therewith circuitry of a configuration to impart constant current amplifier characteristics to said second transistor, an inductor serially connected between the current amplifier and the constant current amplifier and becoming energized upon operation of said current amplifier and said constant current amplifier in response to the activation of said trigger circuit, and discharge circuits including said current amplifier and an asymmetrical current device for dissipating voltages opposing de-energization of said inductor upon return of said trigger circuit to its original output magnitude.

8. An inductor driving circuit comprising a trigger circuit operable in response to the application thereto of a control signal, a current amplifier rendered conductive in response to the operation of the trigger circuit, an inductor connected in series with the current amplifier and energized in response to the conduction of the current amplifier, and means associated with the current amplifier for causing the current amplifier to operate as a constant current amplifier so that the current provided thereby rapidly rises to a predetermined operating level and the inductor is rapidly energized.

9. The circuit as recited in claim 8 wherein the current amplifier is a transistor.

10. An inductor driving circuit comprising a trigger circuit operable in response to the application thereto of a control signal, a first current amplifier rendered conductive in response to the operation of the trigger circuit, a second current amplifier rendered conductive in response to the conduction of the first current amplifier, an inductor connected between the first and second current amplifiers and energized in response to conduction through both current amplifiers, means associated with the second current amplifier for causing the second current amplifier to operate as a constant current amplifier so that the current provided thereby rapidly rises to a predetermined operating level and the inductor is rapidly energized, and a discharge circuit for dissipating voltages opposing deenergization of the inductor when the second current amplifier is rendered nonconductive, the discharge circuit including the first current amplifier and a unidirectional current device.

11. The circuit as recited in claim 10 wherein the current amplifiers are transistors.

12. The circuit as recited in claim 10 wherein the trigger circuit includes a pair of transistors connected as a Schmitt trigger.

References Cited in the file of this patent

UNITED STATES PATENTS

| | | |
|---|---|---|
| 2,934,050 | Pribble | Apr. 26, 1960 |
| 3,005,915 | White et al. | Oct. 24, 1961 |
| 3,005,935 | Wood | Oct. 24, 1961 |